(12) United States Patent
Kurita et al.

(10) Patent No.: US 7,728,102 B2
(45) Date of Patent: Jun. 1, 2010

(54) POLYAMIDE-IMIDE RESIN, FLEXIBLE METAL-CLAD LAMINATE, AND FLEXIBLE PRINTED WIRING BOARD

(75) Inventors: Tomoharu Kurita, Ohtsu (JP); Shinji Suzuki, Ohtsu (JP); Cyuji Inukai, Ohtsu (JP)

(73) Assignee: Toyo Boseki Kabushiki Kaisha, Osaka (JP)

( * ) Notice: Subject to any disclaimer, the term of this patent is extended or adjusted under 35 U.S.C. 154(b) by 906 days.

(21) Appl. No.: 11/515,234

(22) Filed: Aug. 31, 2006

(65) Prior Publication Data

US 2006/0293498 A1    Dec. 28, 2006

Related U.S. Application Data

(63) Continuation of application No. 10/505,697, filed as application No. PCT/JP03/02163 on Feb. 26, 2003, now Pat. No. 7,364,799.

(30) Foreign Application Priority Data

Feb. 26, 2002  (JP)  ................. 2002-50167
Feb. 26, 2002  (JP)  ................. 2002-50168

(51) Int. Cl.
    *C08G 69/08*    (2006.01)
(52) U.S. Cl. ................. 528/310; 528/322; 528/332; 528/353
(58) Field of Classification Search ................. 528/310, 528/322, 332, 353
    See application file for complete search history.

(56) References Cited

U.S. PATENT DOCUMENTS 3,692,740 A  *  9/1972  Suzuki et al. ............... 528/126

| 4,426,147 A | 1/1981 | Bakos et al. |
| 4,497,944 A | 2/1985 | Nishizawa et al. |
| 5,994,432 A | 11/1999 | Michaud |
| 2002/0160211 A1 | 10/2002 | Kurita et al. |

FOREIGN PATENT DOCUMENTS

EP    0 466 616 A1    1/1992

(Continued)

OTHER PUBLICATIONS

Sumibe Techno Research K.K. (ed.), "Yakushin suru Polyimide no Saishin Doko II-Tayoka suru Shurui. Tokusei. Kakosei to Yoto Kakudai no Jittai-" (Dec. 2000), pp. 195-208.
Nagaoka, *Plastics*, 37(7): 87-95 (1986).

*Primary Examiner*—Thao T. Tran
(74) *Attorney, Agent, or Firm*—Leydig, Voit & Mayer, Ltd.

(57) ABSTRACT

The present invention provides a non-halogen polyamide-imide resin soluble in an amide solvent at a concentration of 10%, the resulting varnish, when stored at 5° C. for 1 month, exhibiting a solution viscosity change ((solution viscosity after 1 month–initial solution viscosity)/initial solution viscosity), expressed as an absolute value, of not greater than 3.0, and the resin having a moisture absorption (25° C., 90% RH, 24 hours) of not greater than 2.0%; a flexible metal-clad laminates using such a resin; and a flexible printed wiring board prepared from such a flexible metal-clad laminate by circuit formation. The flexible metal-clad laminate of the invention does not curl under any conditions, including humid conditions, and exhibits excellent dimensional stability since the heat resistant resin used as an insulation material has low moisture absorption and low thermal expansion coefficient and there is less internal stress in the flexible metal-clad laminate. Moreover, since the solder heat resistance and the insulation properties are not impaired even after humidification and since the heat resistant resin is soluble in organic solvents with high solution stability, the flexible metal-clad laminate of the invention can be inexpensively produced.

15 Claims, 1 Drawing Sheet

FOREIGN PATENT DOCUMENTS

| | | |
|---|---|---|
| JP | 62-181488 A | 8/1987 |
| JP | 01-245025 A | 9/1989 |
| JP | 02-098994 A | 4/1990 |
| JP | 05-059174 A | 3/1993 |
| JP | 07-316292 A | 12/1995 |
| JP | 11-228694 A | 8/1999 |
| JP | 2000-239393 A | 9/2000 |
| JP | 2000-289165 A | 10/2000 |

* cited by examiner

POLYAMIDE-IMIDE RESIN, FLEXIBLE METAL-CLAD LAMINATE, AND FLEXIBLE PRINTED WIRING BOARD

CROSS-REFERENCE TO RELATED APPLICATION

This patent application is a continuation of U.S. patent application Ser. No. 10/505,697, filed Aug. 25, 2004 now U.S. Pat. No. 7,364,799.

TECHNICAL FIELD

The present invention relates to a flexible metal-clad laminate that has excellent heat resistance, dimensional stability, adhesion, etc., and that does not curl in any environment; a flexible printed wiring board prepared from such a laminate; and a polyamide-imide resin used for such a laminate. In particular, the present invention relates to a flexible metal-clad laminate which is prepared by continuously applying a polyamide-imide resin solution to a metal foil and drying the coating, and which has excellent heat resistance, dimensional stability, adhesion, etc., exhibits no loss of insulation properties and solder heat resistance and does not curl, even under humidified conditions; a flexible printed wiring board prepared from such a laminate; and a polyamide-imide resin usable for such a laminate.

The term "flexible metal-clad laminate" as used in the present specification and claims refers to a laminate comprising a metal foil and a resin layer, for example, a laminate for use in the production of flexible printed wiring boards and the like. "Flexible printed wiring boards" as used herein collectively refer to so-called flexible printed circuit boards (FPCs), circuit boards for flat cables, tape automated bonding (TAB), etc., that can be produced, for example, according to known methods, such as the subtractive process, using flexible metal-clad laminates, and in which conductor circuits are partially or entirely coated as necessary with a coverlay film, screen printing ink or the like.

BACKGROUND ART

Conventional flexible metal-clad laminates for flexible printed wiring boards comprise a polyimide film and a metal foil bonded by an epoxy resin, acrylic resin or like thermosetting adhesives. Flexible printed wiring boards formed from a flexible metal-clad laminate bonded by such a thermosetting adhesive have the problems that they have a substrate (resin film layer) having an increased thermal expansion coefficient due to the adhesive and therefore have inferior thermal dimensional stability, and that they are inferior in moisture resistance and therefore have impaired insulation properties and solder thermal resistance after humidifying treatment. Moreover, there are other problems that, due to the inferior thermal dimensional stability, the flexible metal-clad laminates or flexible printed wiring boards prepared by forming a circuit using the flexible metal-clad laminate are curled during various heating processes, and due to the inferior moisture resistance, the printed wiring board curls or is distorted during etching and like wet processing, resulting in impaired yields during circuit formation and/or during mounting on the resulting flexible printed wiring boards.

To solve such problems, techniques to form a metal foil directly on an insulating substrate without using an adhesive (i.e., two-layer flexible metal-clad laminates) have been developed. For example, Japanese Unexamined Patent Publication No. 1990-98994 discloses sputtering, Japanese Unexamined Patent Publication No. 1987-181488 discloses vacuum evaporation and Japanese Unexamined Patent Publication No. 1982-18357 discloses ion plating, for the formation of a metal layer (seed layer) over a polyimide film and the subsequent formation of conductive layers is performed by plating. However, all of these methods have problems, such as high production costs, pinhole creation during seed layer formation, and insufficient adhesion between the polyimide film and the conductor.

In an attempt to inexpensively provide high performance flexible printed wiring boards that are not furnished with an adhesive layer, publications such as Japanese Unexamined Patent Publication No. 1982-50670 propose a method for forming a flexible metal-clad laminate wherein a solution of a polyamic acid, i.e., a precursor of a polyimide resin, is directly applied to a metal foil and subjected to dehydration/polyimidization reaction on the metal foil. However, flexible metal-clad laminates obtained by such a method are problematic because their insulation properties after humidification are poor due to the high moisture absorption of the resin, resulting in poor reliability (migration resistance) in applications where high voltage is applied (such as flexible printed wiring boards used at display edges. Furthermore, there are other problems that the solder heat resistance is also decreased after humidification and therefore the application to lead-free soldering (Ag—Sn—Bi-based, Ag—Sn—Cu-based, etc.) is limited, and the printed wiring board curls or is distorted, especially during wet processing or in a highly humid atmosphere, resulting in impaired yields in circuit formation and mounting on flexible printed wiring boards. In addition, after laminate formation (after coating) with the use of the precursor polyamic acid, a heat treatment has to be carried out at high temperatures. Therefore, the use of such a resin for the continuous production of two-layer flexible metal-clad laminates has the problem that productivity is reduced, expensive equipment is necessary, and production costs are increased.

To solve such problems, Japanese Unexamined Patent Publication No. 1993-59174 discloses a resin having excellent heat resistance and small thermal expansion, in which polyamide-imide structures having a trimellitic acid skeleton are randomly copolymerized with polyimide structures, as well as the use of said resin as a base material or a covering material for flexible printed circuit boards. However, there is a problem that once a varnish in which this polyamide-imide resin is dissolved is stored, the viscosity of the solution gradually increases, and in about a month, the solution solidifies and looked like a pudding.

As described above, prior art techniques have not developed flexible metal-clad laminates for producing two-layer-type flexible printed wiring boards, with excellent polyamide-imide resin varnish stability, the flexible printed wiring boards being excellent in dimensional stability and heat resistance, devoid of decrease in solder heat resistance or insulation properties even under humidifying conditions, and free of warpage or distortion in any environment (under humidifying or heating conditions).

An object of the present invention is to solve the problems described above. In particular, an object of the invention is to inexpensively provide a flexible metal-clad laminate for flexible printed wiring boards that are usable even at display edges for which high reliability is required. Specifically, an object of the invention is to inexpensively provide, by directly applying a heat resistant resin solution to a metal foil, a flexible metal-clad laminate for flexible printed wiring boards that have excellent heat resistance, dimensional stability, adhesion, etc., allowing no loss of insulation properties and solder heat resistance and does not curl or dimensionally change, even under humidifying conditions.

DISCLOSURE OF THE INVENTION

The inventors conducted extensive research to achieve the objects described above and succeeded in developing a novel heat resistant resin that can simultaneously satisfy properties such as dissolution in solvents, solution stability, low thermal expansion, and low moisture absorption. In particular, the present invention was accomplished based on the findings described below and further research:

(a) A polyamide-imide resin that simultaneously satisfies dissolution in solvents, solution stability, low thermal expansion, and low moisture absorption can be prepared by using, as repeating units of a polymer chain, plural polyimide skeletons and polyamide-imide skeletons that are insoluble or poorly soluble in organic solvents, and carrying out the copolymerization of the repeating units such that compatibility is maintained; and (b) In producing a flexible metal-clad laminate by applying a heat resistant resin solution to a metal foil and drying the coating, a flexible metal-clad laminate that has excellent heat resistance, dimensional stability, adhesion, etc., allows little decrease in insulation properties and solder heat resistance even under humidifying conditions, and does not curl in any environment can be obtained by controlling the crosslinking reaction of the heat resistant resin.

The present invention includes the following inventions.

The first invention is a non-halogen polyamide-imide resin soluble in an amide 5 solvent at a concentration of 10%, the resulting varnish, when stored at 5° C. for 1 month, exhibiting a solution viscosity change ((solution viscosity after 1 month—initial solution viscosity)/initial solution viscosity), expressed as an absolute value, of 3.0 or less, the resin having a moisture absorption (25° C., 90% RH, 24 hours) of 2.0% or less.

The second invention is a polyamide-imide resin according to the first invention, characterized by having a glass transition temperature of 250° C. or higher.

The third invention is a polyamide-imide resin according to the first or second invention, characterized by having a ratio of imide bond absorbance to benzene nucleus absorbance of not less than 0.9.

The fourth invention is a polyamide-imide resin according to any one of the first to third inventions, characterized by containing ionic impurities in an amount of not greater than 2 mg/kg.

The fifth invention is a polyamide-imide resin according to any one of the first to fourth inventions, characterized by having an acid value of not greater than 150 µeq/g.

The sixth invention is a polyamide-imide resin comprising, as acid components, trimellitic acid anhydride/3,3',4,4'-benzophenone tetracarboxylic acid dianhydride/3,3',4,4'-biphenyl tetracarboxylic acid dianhydride in proportions of 70-90/5-25/5-25 (mol %), and, as a diamine component, 3,3'-dimethyl-4,4'-biphenyldiamine, when the total of acid components and the total of amine component(s), in the polyamide-imide resin, are each taken as 100 mol %.

The seventh invention is a polyamide-imide resin comprising, as acid components, trimellitic acid anhydride/3,3',4,4'-benzophenone tetracarboxylic acid dianhydride/3,3',4,4'-diphenyl ether tetracarboxylic acid dianhydride in proportions of 70-90/5-25/5-25 (mol %), and, as a diamine component, 3,3'-dimethyl-4,4'-biphenyldiamine, when the total of acid components and the total of amine component(s), in the polyamide-imide resin, are each taken as 100 mol %.

The eighth invention is a flexible metal-clad laminate comprising the polyamide-imide resin according to any one of the first to seventh inventions laminated on at least one side of a metal foil.

The ninth invention is a flexible metal-clad laminate according to the eighth invention, wherein the polyamide-imide resin has a moisture absorption dimensional change of not greater than 15 ppm/% RH.

The tenth invention is a flexible metal-clad laminate according to the eighth or ninth invention, wherein the polyamide-imide resin has a thermal expansion coefficient of not greater than 30 ppm/° C.

The eleventh invention is a flexible metal-clad laminate according to any one of the eighth to tenth inventions, characterized by having a curvature radius of curl after humidification (40° C., 90% RH, 24 hours) of not smaller than 70 mm and a curvature radius of a curl after heating (100° C., 1 hour) of not smaller than 70 mm.

The twelfth invention is a flexible printed wiring board prepared from the flexible metal-clad laminate according to any one of the eighth to eleventh inventions by circuit formation.

MODE FOR CARRYING OUT THE INVENTION

Figure 1:
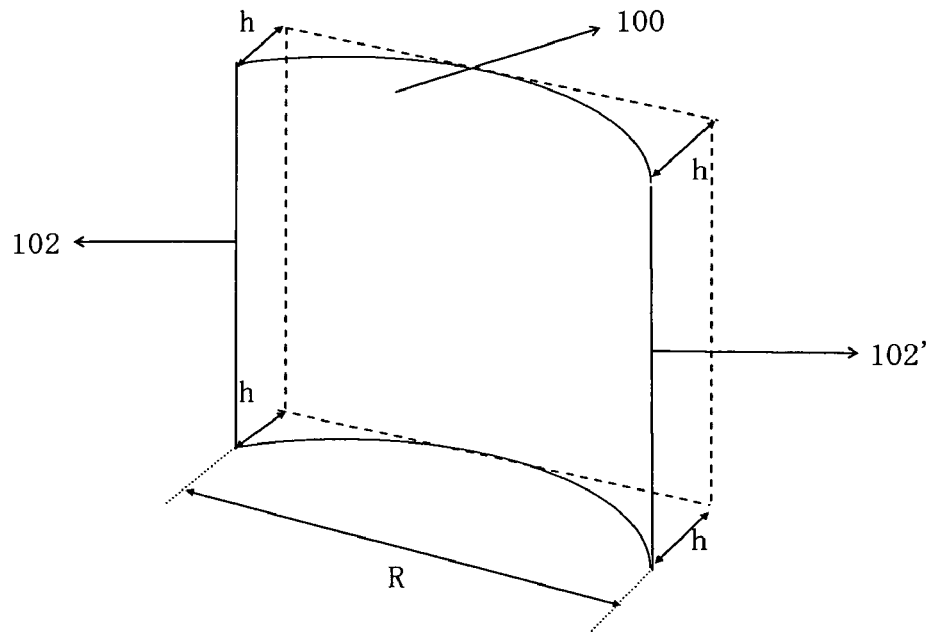
FIG. 1 is an explanatory diagram showing the method for measuring the extent of curl occurred to a flexible metal-clad laminate.

Embodiments of the polyamide-imide resin, flexible metal-clad laminate and flexible printed wiring board of the invention will be described below.

<Polyamide-imide Resin>

The polyamide-imide resin of the invention is soluble in an amide solvent at a concentration of 10%. The varnish thus prepared, when stored at 5° C. for 1 month, exhibits a solution viscosity change ((solution viscosity after 1 month—initial solution viscosity)/initial solution viscosity), expressed as an absolute value, of not greater than 3.0, and the resin has a moisture absorption (25° C., 90% RH, 24 hours) of not greater than 2.0% and is non-halogen.

The phrase "soluble in an amide solvent" herein means that the resin dissolves, at a concentration of not less than 10 wt. %, preferably not less than 15 wt. %, and more preferably 20 wt. %, in a solvent selected from the group consisting of N-methyl-2-pyrrolidone, N,N'-dimethylformamide, N,N'-dimethylacetamide and 1,3-dimethyl-2-imidazolidinone, or in a solvent mixture containing at least one of these solvents in an amount of 20 wt. % or more.

Whether the resin has been dissolved or not can be determined, when the resin is in a solid form, by placing resin particles that pass through a 80-mesh screen in a 200 ml beaker in a predetermined amount and visually observing the solution that has been gently stirred at 25° C. for 24 hours. The resin, available as already dissolved in a solvent, is diluted to a specific concentration to give a solution, and the solution is left to stand at 25° C. for 24 hours. If the solution is free of gelation, heterogeneity, turbidity and precipitation, the resin is regarded as soluble.

A varnish having the polyamide-imide resin of the invention dissolved therein preferably has a solution viscosity change ((solution viscosity after 1 month—initial solution viscosity)/initial solution viscosity), expressed as an absolute value, of not greater than 3.0, when stored at 5 °C. for 1 month. Solution viscosity changes can be determined as follows: the solution viscosity of a varnish, prepared by dissolving the resin in an amide solvent mentioned above at a concentration of 10 wt. %, is measured at 25° C. with a B-type viscometer, immediately after preparation of the varnish, and after storing this varnish at 5° C. for 1 month, the solution viscosity thereof is again measured at 25° C. with B-type viscometer, and the solution viscosity change is determined based on the measured values. The change expressed as absolute value is preferably not greater than 2.0, more preferably not greater than 1.0, and most preferably not greater than 0.20. If the solution viscosity change exceeds 3.0, the varnish has poor storage stability and need to be applied to a metal foil immediately after its production, thereby making it difficult to produce the flexible metal-clad laminate that will be described later.

The moisture absorption (25° C., 90% RH, 24 hours) of the polyamide-imide resin of the invention is not greater than 2.0%, preferably not greater than 1.8%, and more preferably not greater than 1.5%. Moisture absorption herein refers to a value measured according to the method described below using resin films having a length and width of 50±1 mm. Five test samples are used for the measurement.

(1) Test samples are left to stand for 24 hours in a thermostatic chamber maintained at 50±2° C.
(2) The test samples are placed in a weighing bottle in such a manner that the test samples do not come into contact with each other, and left to stand for 24 hours at 25° C. at 90% RH with the weighing bottle lid (hereinafter simply referred to as the lid) open (dust on the surface of the test samples is swept away with a feather or a brush).
(3) The weighing bottle is quickly sealed with the lid and left to stand in a desiccator at room temperature for 1 hour.
(4) The total weight of the weighing bottle and the test samples is measured (W1). The test samples are quickly removed from the weighing bottle and the weight of the weighing bottle alone is measured (W0).
(5) The test samples are placed in the weighing bottle again, and dried for 1 hour in a thermostatic chamber maintained at 100±5° C. with the lid open.
(6) The weighing bottle is quickly sealed with the lid and left to stand in a desiccator at room temperature for 1 hour.
(7) The total weight of the weighing bottle and the test samples is measured (W3). The test samples are quickly removed from the weighing bottle and the weight of the weighing bottle alone is measured (W4).
(8) Moisture absorption WA (%) is calculated according to the following equation:

$$WA=[\{(W1-W0)-(W3-W4)\}/(W1-W0)]\times 100$$

If moisture absorption exceeds 1.5 wt. %, flexible metal-clad laminates curl to a great extent under humid conditions. Accordingly, flexible printed wiring boards prepared by processing such laminates are likely to curl to a great extent, and the dimensional accuracy thereof in carrying out fine part soldering or like processing may sometimes be impaired. Moreover, the solder heat resistance and insulation properties (long-term stability of insulation resistance between conductors, long-term stability of dielectric breakdown voltage between conductors) are likely to be diminished after humidifying treatment.

The non-halogen polyamide-imide resin of the invention having excellent solution stability and low moisture absorption can be prepared by using, as the repeating units of the polymer chain, plural polyimide and polyamide-imide skeletons that are insoluble or poorly soluble in organic solvents and copolymerizing the repeating units such that compatibility is maintained.

In one embodiment, the polyamide-imide resin of the invention is a copolymerized polyamide-imide that comprises constitutional units represented by Formulae (1), (2) and (3) shown below and satisfies the molar ratios of Formula (1)/Formula (2)=1/99 to 99/1 and preferably Formula (1)/Formula (2)=30/70 to 70/30, and {Formula (1)+Formula (2)}/Formula (3)=30/70 to 1/99 and preferably {Formula (1)+Formula (2)}/Formula (3)=20/80 to 5/95. With respect to the molar ratio of Formula (1) to Formula (2), excessively small proportions of the constitutional unit represented by Formula (1) are likely to result in high moisture absorption, and excessively large proportions of the constitutional unit represented by Formula (1) are likely to result in impaired compatibility when molded into films and the like and impaired dynamic property and thermal dimensional stability (thermal expansion coefficient). With respect to the molar ratio of {Formula (1)+Formula (2)} to Formula (3), molar ratio of {Formula (1)+Formula (2)} greater than 30 is likely to result in poor solvent solubility, and a molar ratio of (Formula (1)+Formula (2)) less than 1% is likely to result in impaired dissolution in solvents and unfavorable moisture absorption properties.

Formula (1):

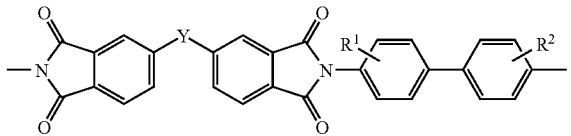

wherein $R^1$ and $R^2$ are the same or different, and independently represent hydrogen or $C_{1-4}$ alkyl or alkoxy; and Y represents a direct linkage (biphenyl linkage) or ether linkage (—O—).

Formula (2):

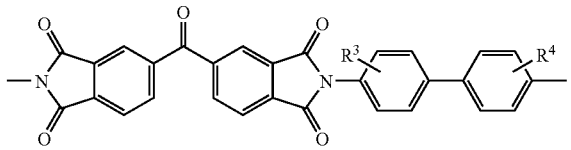

wherein $R^3$ and $R^4$ are the same or different, and independently represent hydrogen or $C_{1-4}$ alkyl or alkoxy.

Formula (3):

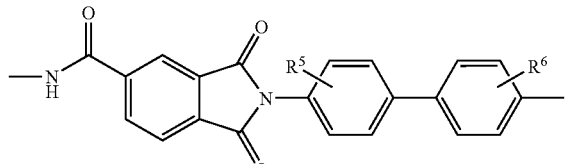

wherein $R^5$ and $R^6$ are the same or different, and independently represent hydrogen or $C_{1-4}$ alkyl or alkoxy.

A preferable embodiment of the invention is a polyamide-imide resin comprising, as acid components, trimellitic acid anhydride/3,3',4,4'-benzophenone tetracarboxylic acid dianhydride/3,3',4,4'-biphenyl tetracarboxylic acid dianhydride in proportions of 70-90/5-25/5-25 (mol %) and, as a diamine component, 3,3'-dimethyl-4,4'-biphenyldiamine when the total of acid components and the total of amine component(s), in the polyamide-imide resin, are each taken as 100 mol %.

Also preferable is a polyamide-imide resin comprising, as acid components, trimellitic acid anhydride/3,3',4,4'-benzophenone tetracarboxylic acid dianhydride/3,3',4,4'-diphenyl ether tetracarboxylic acid dianhydride in proportions of 70-90/5-25/5-25 (mol %) and, as a diamine component, 3,3'-dimethyl-4,4'-biphenyldiamine.

In another embodiment, the polyamide-imide resin of the invention is a copolymerized polyamide-imide that comprises constitutional units represented by Formulae (4), (5) and (6) shown below and satisfies the molar ratios of Formula (4)/Formula (5)=1/99 to 99/1 and preferably Formula (4)/Formula (5)=30/70 to 70/30, and {Formula (4)+Formula (5)}/Formula (6)=50/50 to 1/99 and preferably {Formula (4)+Formula (5)}/Formula (6)=30/70 to 5/95. With respect to the molar ratio of Formula (4) to Formula (5), excessively small proportions of the constitutional unit represented by Formula (4) are likely to result in high moisture absorption, and excessively large proportions of the constitutional unit represented by Formula (4) are likely to result in impaired compatibility when molded into films or the like and impaired dynamic property and thermal dimensional stability (thermal expansion coefficient). With respect to the molar ratio of {Formula (4)+Formula (5)} to Formula (6), excessively large proportions of {Formula (4)+Formula (5)} are likely to result in large thermal expansion coefficient but poor dissolution in solvents, and excessively small proportions of {Formula (4)+Formula (5)} are likely to result in impaired dissolution in solvents and unfavorable moisture absorption properties.

Formula (4):

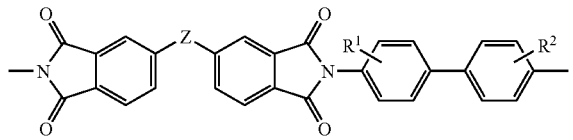

wherein $R^1$ and $R^2$ are the same or different, and independently represent hydrogen or $C_{1-4}$ alkyl or alkoxy; and Z represents —COO—R'—OCO—, wherein R' is a divalent alkylene group or aromatic residue.

Formula (5):

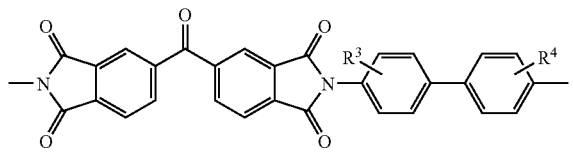

wherein $R^3$ and $R^4$ are the same or different, and independently represent hydrogen or $C_{1-4}$ alkyl or alkoxy.

Formula (6):

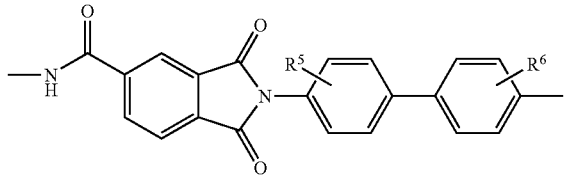

wherein $R^5$ and $R^6$ are the same or different, and independently represent hydrogen or $C_{1-4}$ alkyl or alkoxy.

A preferable embodiment of the invention is a polyamide-imide resin comprising, as acid components, trimellitic acid anhydride/3,3',4,4'-benzophenone tetracarboxylic acid dianhydride/ethylene glycol bis(anhydrotrimellitate) in proportions of 70-90/5-25/5-25 (mol %) and, as a diamine component, 3,3'-dimethyl-4,4'-biphenyldiamine, when the total of acid components and the total of amine component(s), in the polyamide-imide resin, are each taken as 100 mol %.

Also preferable is a polyamide-imide resin comprising as acid components trimellitic acid anhydride/3,3',4,4'-benzophenone tetracarboxylic acid dianhydride/propylene glycol bis(anhydrotrimellitate) in proportions of 70-90/5-25/5-25 (mol %) and as a diamine component 3,3'-dimethyl-4,4'-biphenyldiamine.

Further preferable is a polyamide-imide resin comprising as acid components trimellitic acid anhydride/3,3',4,4'-benzophenone tetracarboxylic acid dianhydride/2,2-bis(4-hydroxyphenyl)propanedibenzoate-3,3',4,4'-tetracarboxylic acid dianhydride in proportions of 70-90/5-25/5-25 (mol %) and as a diamine component 3,3'-dimethyl-4,4'-biphenyldiamine.

The polyamide-imide resin of the invention can be produced according to conventional methods, such as the isocyanate methods, the acid chloride methods, the low-temperature solution polymerization methods, the room-temperature solution polymerization methods, etc. In view of production cost and minimizing unreacted functional groups (carboxyl groups), a particularly preferable production method is an isocyanate method in which the polymer is produced by decarboxylation.

Raw materials (acid components and amine components) for introducing the polyimide skeletons represented by Formulae (1), (2), (4) and (5) into the polymer include those listed below.

As acid components, benzophenone-3,3',4,4'-tetracarboxylic acid, biphenyl-3,3',4,4'-tetracarboxylic acid, diphenyl ether-3,3',4,4'-tetracarboxylic acid, and monoanhydrides, dianhydrides and esters of alkylene glycol bis(trimellitate) or bisphenol bis(trimellitate) represented by Formula (7) below may be used singly or in combination.

Formula (7):

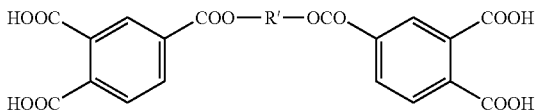

wherein R' is an alkylene group or a divalent aromatic residue.

As amine components, 3,3'-dimethyl-4,4'-diaminobiphenyl, 3,3'-diethyl-4,4'-diaminobiphenyl, 2,2'-dimethyl-4,4'-diaminobiphenyl, 2,2'-diethyl-4,4'-diaminobiphenyl, 3,3'-dimethoxy-4,4'-diaminobiphenyl, 3,3'-diethoxy-4,4'-diaminobiphenyl, and their corresponding diisocyanates may be used singly or in combination.

Moreover, in addition to the compounds described above, it is possible to copolymerize the acid components and amine components given below insofar as the effect of the invention is not impaired.

As such acid components, usable are monoanhydrides, dianhydrides and esters of pyromellitic acid, 3,3'-diphenylsulfone tetracarboxylic acid, naphthalene-2,3,6,7-tetracarboxylic acid, naphthalene-1,2,4,5-tetracarboxylic acid, naphthalene-1,4,5,8-tetracarboxylic acid and the like. One of them may be used singly or at least two of them may be used in combination.

As such amine components, usable are p-phenylenediamine, m-phenylenediamine, 3,4'-diaminodiphenyl ether, 4,4'-diaminodiphenyl ether, 4,4'-diaminodiphenylsulfone, 3,3'-diaminodiphenylsulfone, 3,4'-diaminobiphenyl, 3,3'-diaminobiphenyl, 3,3'-diaminobenzanilide, 4,4'-diaminobenzanilide, 4,4'-diaminobenzophenone, 3,3'-diaminobenzophenone, 3,4'-diaminobenzophenone, 2,6-tolylenediamine, 2,4-tolylenediamine, 4,4'-diaminodiphenylsulfide, 3,3'-diaminodiphenylsulfide, 4,4'-diaminodiphenylpropane, 3,3'-diaminodiphenylpropane, 3,3'-diaminodiphenylmethane, 4,4'-diaminodiphenylmethane, p-xylenediamine, m-xylenediamine, 1,4-naphthalenediamine, 1,5-naphthalenediamine, 2,6-naphthalenediamine, 2,7-naphthalenediamine, 2,2'-bis(4-aminophenyl)propane, 1,3-bis(3-aminophenoxy)benzene, 1,3-bis(4-aminophenoxy)benzene, 1,4-bis(4-aminophenoxy)benzene, 2,2-bis[4-(4-aminophenoxy)phenyl]propane, bis[4-(4-aminophenoxy)phenyl]sulfone, bis[4-(3-aminophenoxy)phenyl]sulfone, bis[4-(3-aminophenoxy)phenyl]propane, 4,4'-bis(4-aminophenoxy)biphenyl, 4,4'-bis(3-aminophenoxy)biphenyl, and their corresponding diisocyanates. One of them may be used singly or at least two of them may be used in combination.

Raw materials (acid components and amine components) for introducing the polyamide-imide skeletons represented by Formulae (3) and (6) include those listed below.

As the acid components, trimellitic acid or its monoanhydride, esters and the like can be used singly or in combination. As the amine components, the aforementioned diamines mentioned in connection with the polyimide skeletons, or their corresponding diisocyanates, can be used singly or in combination.

Moreover, in addition to the compounds given above, it is possible to copolymerize the acid components and amine components given below insofar as the effect of the invention is not impaired.

As such acid components, monoanhydrides, esters and the like of tricarboxylic acids such as diphenylether-3,3',4'-tricarboxylic acid, diphenylsulfone-3,3',4'-tricarboxylic acid, benzophenone-3,3',4'-tricarboxylic acid, naphthalene-1,2,4-tricarboxylic acid can be used singly or in combination. As such amine components, the aforementioned diamines mentioned in connection with the polyimide skeletons, or their corresponding diisocyanates, can be used singly or in combination.

One of the features of the present invention is that no halogen compounds are contained in the polymer chain. This means that halogen-containing monomers, such as 3,3'-dichloro-4,4'-diaminobiphenyl and 3,3'-dibromo-4,4'-diaminobiphenyl are not used.

Although objects of the invention such as ability to dissolve in solvents, low thermal expansion, etc., may be achieved using such halogen-containing monomers, applications of such a polyamide-imide resin are limited in view of environmental issues, and therefore, the use of halogen-containing monomers is not preferable.

The polyamide-imide resin for use in the present invention preferably has a molecular weight corresponding to an inherent viscosity in N-methyl-2-pyrrolidone (polymer concentration: 0.5 g/dl) at 30° C. of 0.3 to 2.5 dl/g, and more preferably 0.8 to 2.0 dl/g. A resin with an inherent viscosity of less than 0.3 dl/g is likely to have insufficient mechanical characteristics when processed into molded products such as films. On the other hand, an inherent viscosity not lower than 2.0 dl/g results in increased viscosity of the solution, sometimes making processing difficult.

In the preparation of the polyamide-imide resin for use in the present invention, insofar as the objects of the invention in respect of, e.g., moisture absorption property, heat resistance, insulation properties, dimensional stability (thermal expansion coefficient), dissolution in solvents, etc., are not impaired, it is possible to use acid components such as adipic acid, azelaic acid, sebacic acid, cyclohexane-4,4'-dicarboxylic acid, butane-1,2,4-tricarboxylic acid, butane-1,2,3,4-tetracarboxylic acid, cyclopentane-1,2,3,4-tetracarboxylic acid and like aliphatic and alicyclic dicarboxylic acids and polycarboxylic acids, and monoanhydrides, dianhydrides and esters thereof; and amine components such as tetramethylenediamine, hexamethylenediamine, isophoronediamine, 4,4'-dicyclohexylmethanediamine, cyclohexane-1,4-diamine, diaminosiloxane and like aliphatic and alicyclic diamines and their corresponding diisocyanates, which can be used singly or in combination. Moreover, it is possible to admix a resin that has been separately prepared by carrying out polymerization using a combination of these acid and amine components.

Chain stopper monomers may be used for chain stopping the terminals of the polyamide-imide resin of the invention. For example, monocarboxylic acids and mono anhydrides such as phthalic anhydride, benzoic acid and the like, or monoamines and monoisocyanates such as aniline, phenyl isocyanate and the like are usable.

Regarding the acid component-amine component mole balance, it is preferable that the acid/amine molar ratio be in the range of 1.1 to 0.9, more preferably 1.00 to 1.05, i.e., slight excess of acid component. It is preferable that the purity of anhydride in the acid components is not less than 95%, and more preferably not less than 99%.

Figure 2:
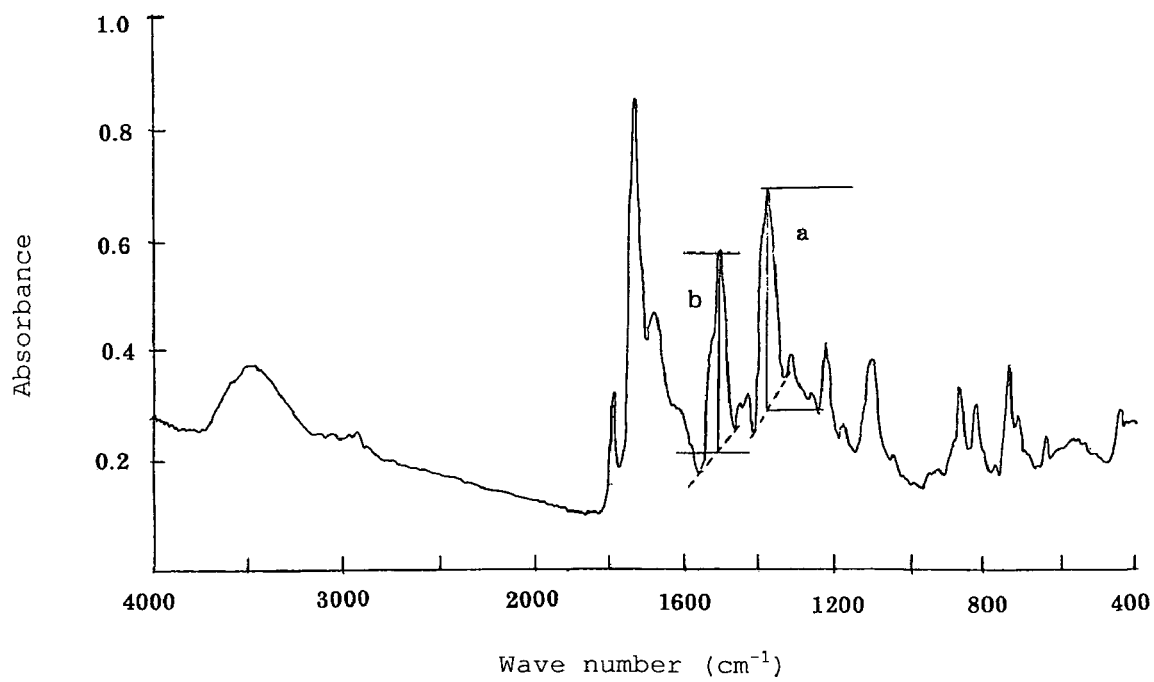
FIG. 2 shows the IR spectum of the polyamide-imide resin obtained in Example 3.

Among the polyamide-imide resin of the invention, preferable are those having a ratio of the imide bond absorbance to the benzene nucleus absorbance of not less than 0.9, and more preferably not less than 1.0. Although not particularly limited, the upper limit thereof is preferably less than 5.0. When the imide bond absorbance is less than 0.9, moisture absorption properties of the resin becomes unfavorable, and the resulting flexible printed wiring board tends to have insufficient long-term stabilities of dielectric breakdown voltage between conductors and insulation resistance between conductors, and solder heat resistance after humidifying treatment. The absorbance ratio herein can be determined by the measurement method described below. A powdery sample obtained by scraping the surface of a resin film (the surface not in contact with a metal foil) is subjected to absorbance measurement by the KBr method using an infrared spectrophotometer (Model 270-3, manufactured by Hitachi, Ltd.). As shown in FIG. 2, the absorbance (a) of imide at 1380 cm$^{-1}$ and the absorbance (b) of benzene nucleus at 1500 cm$^{-1}$ are each determined by measuring the peak height from the baseline drawn between bottom parts of the peak, and calculating the absorbance ratio (b/a). In the measurement, sample concentration adjustment and milling are carried out such that the absorbance of the benzene nucleus is within the range of 0.5 to 0.7 in terms of absolute value and the height from the baseline is 0.2 or greater in terms of absorbance.

The polyamide-imide resin of the invention preferably contains ionic impurities in an amount of not more than 2 mg/kg, more preferably not more than 1.5 mg/kg, and particularly preferably not more than 1 mg/kg. Although a lower limit is not particularly restricted, it is preferably as close to 0 mg/kg as possible. Ionic impurities exceeding 2 mg/kg are likely to result in impaired solder heat resistance and insulation properties after humidification which will be described below. Ionic impurities are measured by cutting a substrate film into 1 cm×1 cm pieces, placing 5 g thereof in a quartz beaker, adding 50 ml of ultrapure water, heat treating the system in an autoclave at 120° C. for 20 hours to obtain a sample (pure water recovered after the extraction), and elementally quantifying Na, K and Li contained in the sample by atomic absorption spectrophotometry.

The polyamide-imide resin of the invention preferably has an acid value of not greater than 150 µeq/g, more preferably not greater than 130 µeq/g, and particularly preferably not greater than 120 µeq/g. Acid values exceeding 150 µeq/g results in unfavorable moisture absorption properties of the resin, and the resulting flexible printed wiring boards are likely to be insufficient in long-term stabilities of dielectric breakdown voltage between conductors and insulation resistance between conductors, and in solder heat resistance after humidifying treatment. From the standpoint of long-term stabilities of dielectric breakdown voltage between conductors and insulation resistance between conductors or from the standpoint of solder heat resistance after humidification treatment, lower limit of acid values is not particularly restricted. However, excessively low acid values are likely to impair adhesion strength. The lower limit thereof varies according to the insoluble content of the heat resistant resin film layer which will be described below. In particular, when insoluble content is high, not less than 5 µeq/g is preferable. The reason is considered as follows: As the insoluble content increases, the degree of crosslinking of the resin film layer increases to alter mechanical properties such as elasticity, affecting the adhesion.

Although controllable by polymerization conditions such as polymerization temperature and polymerization time, the imide bond absorbance and the acid value of the polyamide-imide resin of the invention can usually be controlled by the mole balance of acid components to amine components, use of chain stoppers, the amount of anhydride groups in the acid components (control of monomer purity and/or water content) or the like.

The polyamide-imide resin of the invention preferably has a glass transition temperature of not lower than 250° C., more preferably not lower than 280° C., and particularly preferably not lower than 300° C. Although not particularly restricted, the upper limit is less than 450 °C. in view of varnish stability. Glass transition temperatures of less than 250° C. may impair the solder heat resistance. The glass transition temperature is measured using a resin film as a sample (weight: 1 g, sample size: 4 (width)×20 (length) mm, heating rate: 10° C./min, atmosphere: nitrogen). The measurement is conducted with respect to a film that has been heated in a nitrogen atmosphere to the point of inflection at a heating rate of 10° C./min and cooled to room temperature.

<Polyamide-imide Resin Solution>

In view of environmental issues, solvents usable for preparing polyamide-imide resin solutions for use in the present invention are preferably organic solvents that do not contain halogen atoms, i.e., non-halogen organic solvents. Typical examples of such organic solvents are N-methyl-2-pyrrolidone, N,N'-dimethylformamide, N,N'-dimethylacetamide, 1,3-dimethyl-2-imidazolidinone, tetramethylurea, sulfolane, dimethylsulfoxide, γ-butyrolactone, cyclohexanone, cyclopentanone and the like, with N-methyl-2-pyrrolidone being preferable. When any of these solvents is used as a polymerization solvent, the resulting solution as such can be used as a solution for flexible metal-clad laminate production which will be described below. These solvents can be partially replaced by toluene, xylene and like hydrocarbon organic solvents; diglyme, triglyme, tetrahydrofuran and like ether organic solvents; and methyl ethyl ketone, methyl isobutyl ketone and like ketone organic solvents. To improve various properties of flexible metal-clad laminates and flexible printed wiring boards, such as mechanical properties, electrical properties, slippage and flame resistance, the aforementioned heat resistant resin solution of the invention may contain, or may be used after reaction with, other resins, organic compounds and/or inorganic compounds, if so desired. Examples thereof include lubricants (silica, talc, silicone, etc.), adhesion promoters, flame retardants (phosphorus-based and triazine-based compounds, aluminum hydroxide, etc.), stabilizers (antioxidants, ultraviolet absorbers, polymerization inhibitors, etc.), electroplating activators, organic and inorganic fillers (talc, titanium oxide, fine particles of fluorine-containing polymers, pigments, dyes, calcium carbide, etc.), silicone compounds, fluorine compounds, isocyanate compounds, blocked isocyanate compounds, acrylic resins, urethane resins, polyester resins, polyamide resins, epoxy resins, phenol resins and like resins and organic compounds, curing agents of such resins, silicon oxides, titanium oxides, calcium carbonate, iron oxides and like inorganic compounds. These compounds are usable insofar as the objects of the invention are not impaired.

The concentration of the polyamide-imide resin in the polyamide-imide resin solution (varnish) thus obtained may be selected from a broad range, but it is preferably about 5 to about 40% by weight, and particularly preferably about 8 to about 20% by weight. When the concentration is outside the above ranges, coatability is likely to be decreased.

<Metal Foil>

Metal foils usable in the invention include copper foils, aluminum foils, steel foils, nickel foils, or the like, and also include composite metal foils comprising these metal foils and metal foils treated with zinc, chromium compounds or other metals. Although the metal foil thickness is not limited, a metal foil having a thickness ranging, e.g., from 3 to 50 µm is favorably used.

Metal foils usable in the invention are usually in the form of a ribbon, and their length is not limited. Although not particularly limited, the width of such ribbon form foils is preferably about 25 to about 300 cm, and particularly about 50 to about 150 cm.

<Production Method for Flexible Metal-clad Laminate>

The flexible metal-clad laminate of the invention can be obtained by a method comprising the steps of:

(A) applying a polyamide-imide resin solution to the metal foil and predrying the coating film; and (B) heat-treating and drying the laminate comprising the metal foil and the predried coating film obtained in (A) above (hereinafter referred to as a "heat-treatment/solvent removal step"). In this manner, the flexible metal-clad laminate of the invention is produced.

Conditions such as temperature and duration of the heat treatment/solvent removal step may preferably be selected such that the insoluble content of the resin layer after the heat treatment/solvent removal step is not less than 1%. With an insolubility content of less than 1%, depending on the composition of the heat resistant resin, flexible metal-clad laminates and flexible printed wiring boards that are prepared by forming circuits using such laminates are likely to exhibit insufficient solder heat resistance and insulation properties, particularly solder heat resistance and insulation properties (long-term stabilities of dielectric breakdown voltage between conductors and insulation resistance between conductors) after humidifying treatment.

In addition to the properties of the heat resistant resin used, it is an important point in the invention that the heat resistant resin layer maintains a certain degree of crosslinked structure. By controlling the insoluble content, which is a proxy for the crosslinked structures, to be not less than 1%, a flexible metal-clad laminate that has excellent solder heat resistance and insulation properties (long-term stabilities of dielectric breakdown voltage between conductors and insulation resistance between conductors) after humidifying treatment can be obtained. This is presumably attributable to the following effects:

Due to the crosslinking reaction, the number of functional groups, such as carboxyl groups, that adversely affect the moisture absorption properties is reduced; and Due to the crosslinking reaction, the physical heat resistance of the resin film layer is increased.

The term "insoluble content" refers to the content of insoluble matter contained 2 0 in the resin layer, that is determined by removing the metal foil, adding the remaining resin layer to N-methyl-2-pyrrolidone to prepare a solution containing the resin at a concentration of 0.5 wt. % and maintaining the solution at 100° C. for 2 hours, and is obtained by the following formula:

Insoluble content (%)=[$Mi/Mf$]×100 wherein Mi represents the weight (g) of insoluble matter and Mf represents the weight (g) of resin film.

Although the upper limit of insoluble content may vary depending on the acid value of the polyamide-imide resin used, it is usually not greater than 99%, and preferably not greater than 85%. When the acid value of the resin used is low, an insoluble content of 99% or greater is likely to impair adhesion strength.

When the heat resistant resin film layer formed is solvent-soluble, the acid value of a solvent-soluble portion is 5 to 150 μeq/g. Acid values of not greater than 5 μeq/g are likely to decrease adhesion strength, and acid values of not less than 150 μeq/g are likely to impair the long-term stabilities of dielectric breakdown voltage between conductors and insulation resistance between conductors.

The heat treatment is preferably conducted at temperatures not greater than (Tg+50)° C. In view of productivity, the minimun heat treatment/solvent removal temperature is (Tg−250)° C. Herein, "Tg" refers to the glass transition temperature of the polyamide-imide resin expressed in Celsius.

<Flexible Metal-clad Laminate>

The flexible metal-clad laminate of the invention has the polyamide-imide resin laminated to at least one side of the metal foil.

The moisture absorption dimensional change of the polyamide-imide resin in the flexible metal-clad laminate of the invention is preferably not greater than 15 ppm/% RH, more preferably not greater than 12 ppm/% RH, and particularly preferably not greater than 10 ppm/% RH. The lower limit is not particularly restricted, but it is preferable to be as close to 0 ppm/% RH as possible. If moisture absorption dimensional changes exceed 15 ppm/% RH, flexible metal-clad laminates and flexible printed wiring boards are likely to curl to a great extent during humidification, and the yield of circuit formation is likely to decrease. The moisture absorption dimensional change is measured according to the following method:

(1) Holes are drilled in the metal-clad laminate at specific positions thereof according to IPC-FC 241 (IPC-TM-650, 2.2.4(c)). After humidification at 25° C. at 65% RH for 4 hours, the distances between the holes are measured.

(2) The metal layer of the metal-clad laminate is completely removed (etched) with ferric chloride. The resin film thus obtained is humidified in a 20% RH, 40% RH, 65% RH, or 90% RH atmosphere at 25° C. for 24 hours.

(3) The distances between the holes in the resin film are measured according to IPC-FC 241 (IPC-TM-650, 2.2.4 (c)), and the dimensional change is calculated based on the distances between the holes in the metal-clad laminate under item (1).

(4) The dimensional change obtained in item (3) is plotted in relation to the respective relative humidities. The moisture absorption dimensional change is defined as the slope exhibited in relation to the relative humidities.

The thermal expansion coefficient of the polyamide-imide resin in the flexible metal-clad laminate is preferably not greater than 30 ppm/° C., more preferably not greater than 25 ppm/° C., and particularly preferably not greater than 20 ppm/° C. Although the lower limit is not particularly restricted, not less than 5 ppm/° C. is preferable since the greater the difference between the thermal expansion coefficient of the resin and that of 15 the metal foil, the greater the distortion in the laminate. Herein, the thermal expansion coefficient is measured using a TMA (thermomechanical analyzer/manufactured by Rigaku Corporation), according to tension mode, with respect to the resin film layer obtained by removing the metal foil of the flexible metal-clad laminate by etching (weight: 1 g, sample size: 4 (width)×20 (length) mm, heating rate: 10° C./min, atmosphere: nitrogen, measurement temperature range: 100° C. to 200° C.). The measurement is conducted with respect to a film that has been heated in a nitrogen atmosphere to the point of inflection at a heating rate of 10° C./min and cooled to room temperature.

With thermal expansion coefficients exceeding 30 ppm/° C., dimensional stability is impaired, and thereby the flexible metal-clad laminate (due to aggravated internal distortion occurred during the production of the flexible metal-clad laminate) curls to a great extent, particularly when the flexible metal-clad laminate is left in ordinary environmental conditions or when heated (dehumidified), and accordingly, flexible printed wiring boards prepared by processing the flexible metal-clad laminate also curl to a great extent when such flexible printed wiring boards are left in ordinary environmental conditions or when heated.

In a two-layer structure composed of a metal foil and a resin film layer, curling during the aforementioned heating or humidification occurs to a different extent depending on the type and thickness of metal foil used. With respect to generally-used 9 to 18 μm metal foils, the resin layer side is likely to become convex during humidification, and the metal foil layer side is likely to become convex during heating (or dehumidification). Therefore, flexible printed wiring boards prepared by forming circuits on such flexible metal-clad laminates are likely to exhibit a similar behavior. Thus, flexible printed wiring boards are distorted or curl (warp) in the wet step or heating step during circuit formation, or during mounting on flexible printed wiring boards after circuit formation.

The flexible metal-clad laminate of the invention has a curl having a curvature radius of not smaller than 70 mm after humidification (40° C., 90% RH, 24 hours) and a curl having a curvature radius of not smaller than 70 mm after heating (100° C., 1 hour), more preferably not smaller than 100 mm and particularly preferably not smaller than 120 mm after humidification, and more preferably not smaller than 100 mm and particularly preferably not smaller than 120 mm after heating. The upper limit is not particularly restricted and is preferably infinite. An infinite radius of curvature means the absence of curling. Herein, curling is measured by placing a flexible metal-clad laminate sample (sample size: 10 cm×10 cm) in a free state (a state in which no weight is applied in the direction of curling) as shown in FIG. 1, measuring the distance (R) between the ends 102 and 102', which do not lie on the vertical plane due to the curl of sample 100, and distance h between the vertical plane and the ends 102 and 102'; and calculating the radius of curvature r using the following equation:

$$\text{Radius of curvature } (r) = (h/2) + (1/8) \times (R^2/h)$$

The glass transition temperature of the polyamide-imide resin in the flexible metal-clad laminate of the invention is preferably not lower than 250° C., more preferably not lower than 280° C., and particularly preferably not lower than 300° C. Although the upper limit is not particularly restricted, less than 450° C. is preferable in view of varnish stability, etc. Glass transition temperatures of less than 250° C. may impair solder heat resistance.

The glass transition temperature is measured using a TMA (thermomechanical analyzer/manufactured by Rigaku Corporation), according to tension mode, with respect to a resin film layer obtained by removing the metal foil of the flexible metal-clad laminate by etching (weight: 1 g, sample size: 4 (width)×20 (length) mm, heating rate: 10° C./min, atmosphere: nitrogen). This measurement is conducted with respect to a film that has been heated in a nitrogen environment to the point of inflection at a heating rate of 10° C./min and cooled to room temperature.

The polyamide-imide resin in the flexible metal-clad laminate of the invention preferably has a ratio of imide bond absorbance to benzene nucleus absorbance of not less than 0.9 and more preferably not less than 1.0. Although the upper limit is not particularly restricted, less than 5.0 is preferable in view of varnish stability. An absorbance ratio of less than 0.9 results in unfavorable moisture absorption properties of the resin, and the flexible printed wiring boards are likely to have insufficient long-term stabilities of dielectric breakdown voltage between conductors and insulation resistance between conductors and insufficient solder heat resistance after humidifying treatment. The absorbance ratio herein refers to a value obtained by the same measurement method described with respect to the aforementioned polyamide-imide resin.

A polyamide-imide resin in the flexible printed metal-clad laminate of the invention that comprises as acid components trimellitic acid anhydride/3,3',4,4'-benzophenone tetracarboxylic acid dianhydride/3,3',4,4'-biphenyl tetracarboxylic acid dianhydride in proportions of 70-90/5-25/5-25 (mol %) and as a diamine component 3,3'-dimethyl-4,4'-biphenyldiamine, or that comprises as acid components trimellitic acid anhydride/3,3',4,4'-benzophenone tetracarboxylic acid dianhydride/3,3',4,4'-diphenyl ether tetracarboxylic acid dianhydride in proportions of 70-90/5-25/5-25 (mol %) and as a diamine component 3,3'-dimethyl-4,4'-biphenyldiamine, when the total of acid components and the total of amine component(s) are each taken as 100 mol %, is most preferable for inexpensively producing flexible metal-clad laminates for flexible printed wiring boards that have excellent heat resistance, dimensional stability, adhesion, etc., and exhibit no loss of insulation properties and solder heat resistance, and do not curl or dimensionally change, even under humidifying conditions.

In the flexible metal-clad laminate of the invention comprising the heat resistant resin film layer and the metal foil, the thickness of the heat resistant resin film layer can be selected from a broad range, and the thickness thereof after thorough drying is usually about 5 to about 100 µm, and preferably about 10 to about 50 µm. A thickness of less than 5 µm is likely to impair handleability and mechanical properties such as film strength. On the other hand, a thickness exceeding 100 µm is likely to impair properties such as flexibility and processability (drying property, coatability).

<Flexible Printed Wiring Board>

Flexible printed wiring boards can be produced using the flexible metal-clad laminate of the invention according to conventional methods, e.g., the subtractive process. For coating the circuit surface with a solder resist or for protecting the conductor circuit from dirt or scratching, conventional methods can be employed, e.g., a heat resistant film such as polyimide is placed over the circuit board (base board on which a conductive circuit has been formed) via adhesive, or a liquid coating agent is applied to a circuit board by screen printing. As such heat resistant film, a polyimide film can be used, and as an adhesive for the heat resistant film, polyester-based, polyurethane-based, polyester urethane-based or epoxy-based adhesives, or mixtures of 2 or more of these can be used. As the liquid coating agent, known epoxy- or polyimide-based inks can be used, with polyimide-based inks being preferable in view of heat resistance, moisture resistance and insulation properties (migration resistance). It is possible to directly stick an epoxy- or polyimide-based adhesive sheet on a circuit board. Flexible printed wiring boards thus obtained have excellent heat resistance, dimensional stability, adhesion, insulation properties, etc.; exhibit less degree of deterioration of solder heat resistance (300° C. or higher) and insulation properties (long-term stabilities of dielectric breakdown voltage between conductors and insulation resistance between conductors: 1000 hours or longer) even after humidification; and curl to a lesser degree in any environment including humid atmosphere, thereby giving industrially significant advantages.

It is usually necessary for flexible printed wiring boards that are used in applications in which high voltage is applied, such as those used at the edges of displays such as plasma displays, to have an insulation reliability corresponding to a insulation resistance between conductors of not less than $1.0 \times 10^{10}$ Ω and a dielectric breakdown voltage between conductors of not less than 1.0 KV even under humid conditions. While conventional flexible printed wiring boards have insufficient insulation reliability, the flexible printed wiring board of the invention attains high reliability in such applications. "Long-term stabilities of dielectric breakdown voltage between conductors and insulation resistance between conductors" herein are evaluated by comparing the values obtained from a flexible printed wiring board that has been subjected to heating and humidifying treatments while applying 100 V or greater voltage to the conductive circuit thereof with the values obtained with respect to the flexible printed wiring board under ordinary conditions.

EXAMPLES

Examples are given below to illustrate the invention in more detail, but the scope of the invention is not limited to these examples. In the examples, properties were measured according to the measurement methods described below. The powdery polymer samples used in the measurements were prepared by purifying the polymerization solutions obtained in the examples by reprecipitation using a large amount of acetone. Resin films (substrate films) were obtained by removing (etching), with 35% ferric chloride (40° C.), the metal foils of the flexible metal-clad laminates obtained in the examples and comparative examples.

[Solution Viscosity Change]

The solution viscosity of a varnish, immediately after dissolving a resin in N-methyl-2-pyrrolidone at a concentration of 10 wt. %, was measured at 25° C. using a B-type viscometer. After storing this varnish at 5° C. for 1 month, the solution viscosity was once again measured at 25° C. using the B-type viscometer. Based on the values thus measured, the change in solution viscosity {(solution viscosity after 1 month—initial solution viscosity)/initial solution viscosity} was determined and expressed as an absolute value.

[Inherent Viscosity]

A powdery polymer sample was dissolved in N-methyl-2-pyrrolidone to a polymer concentration of 0.5 g/dl. The solution viscosity of the resulting solution and solvent viscosity at 30° C. were measured with an Ubbelohde's viscometer, and the inherent viscosity was calculated using the following equation:

Inherent viscosity (dl/g)=[ln($V1/V2$)]/$V3$ wherein V1 represents the solution viscosity measured with an Ubbelohde's viscometer and V2 represents the solvent viscosity measured with an Ubbelohde's viscometer. V1 and V2 were determined based on the time the polymer solution and the solvent (N-methyl-2-pyrrolidone) needed to pass through the capillary of the viscometer. V3 is the polymer concentration (g/dl).

[Glass Transition Temperature]

The glass transition temperature of the resin film layer, obtained by removing the metal foil of the flexible metal-clad laminate of the invention by etching, was measured using a TMA (thermomechanical analyzer/manufactured by Rigaku Corporation), according to tension mode, under the conditions described below. This measurement was conducted with respect to a film that had been heated in a nitrogen atmosphere to the point of inflection at a heating rate of 1° C./min and cooled to room temperature.
  Load: 1 g
  Sample size: 4 (width)×20 (length) mm
  Heating rate: 10° C./min.
  Atmosphere: nitrogen

[Thermal Expansion Coefficient]

The thermal expansion coefficient of the resin film layer, obtained by removing the metal foil of the flexible metal-clad laminate of the invention by etching,[ ]was measured using a TMA (thermomechanical analyzer, manufactured by Rigaku Corporation), according to tension mode, under the conditions described below. This measurement was conducted with respect to a film that had been heated in a nitrogen atmosphere to the point of inflection at a heating rate of 10° C./min and cooled to room temperature.
  Load: 1 g
  Sample size: 4 (width)×20 (length) mm
  Heating rate: 10° C./min.
  Atmosphere: nitrogen
  Measurement temperature range: 100° C. to 200° C.

[Insoluble Content Measurement]

A flexible metal-clad laminate was immersed in ferric chloride at 40° C. (concentration: 35 wt. %) to etch and remove the metal foil therefrom. The resin film thus obtained was dissolved in N-methyl-2-pyrrolidone, giving an N-methyl-2-pyrrolidone solution containing the resin film layer at a concentration of 0.5 wt. %. The solution was prepared using a 100 ml Erlenmeyer flask.

Subsequently, this solution was heat-treated at 100° C. (by immersing the Erlenmeyer flask in an oil bath at 100° C.) for 2 hours. The Erlenmeyer flask was then cooled to room temperature. The insolubles in the Erlenmeyer flask was collected by filtration using a glass filter (No. 3G-2) while being washed with 100 ml of N-methyl-2-pyrrolidone.

Thereafter, the glass filter containing the insolubles was vacuum-dried at 200° C. for 20 hours. The weight of the dried glass filter was measured. From this weight was subtracted the weight of the glass filter alone which had been measured beforehand, thereby determining the weight of the insolubles. The insoluble content was calculated from the weight of insoluble (Mi) and the weight of resin film (Mf) using the following equation:

Insoluble content (%)=[$Mi/Mf$]×100 wherein Mi represents the weight (g) of the insolubles, and Mf represents the weight (g) of the resin film.

[Solder Heat Resistance (Under Ordinary Conditions)]

A 1 mm-width circuit pattern was formed by etching the metal foil of a flexible metal-clad laminate according to the subtractive process (35% ferric chloride solution), thereby giving a sample. This sample was conditioned at a temperature of 25° C. and a humidity of 65% for 24 hours, subjected to flux cleaning, immersed in a wave solder bath at 320° C. for 20 seconds, and microscopically observed for the presence or absence of peelings and blisters. The symbol "o" indicates the absence of peelings and blisters. The symbol "x" indicates the presence of peelings and/or blisters.

[Solder Heat Resistance (After Humidifying Treatment)]

A 1 mm-width circuit pattern was formed by etching the metal foil of a flexible metal-clad laminate according to the subtractive process (35% ferric chloride solution), thereby giving a sample. This sample was conditioned at a temperature of 40° C. and a humidity of 90% for 24 hours, subjected to flux cleaning, immersed in a wave solder bath at 320° C. for 20 seconds, and microscopically observed for the presence or absence of peelings and blisters. The symbol "o" indicates the absence of peelings and blisters. The symbol "x" indicates the presence of peelings and/or blisters.

[Acid Value Measurement]

The acid values of powdery polymer samples and resin film layers were measured using an automatic potentiometric titrator AT-310 manufactured by Kyoto Electronics Manufacturing Co., Ltd., under the conditions described below. With respect to the acid value of an resin film layer, the filtrate obtained in the aforementioned insoluble content measurement was used (the weight of a sample was calculated by subtracting the weight of the insolubles based on its insoluble content). Titrating solution: 1/50 N potassium hydroxide (ethanol/dimethyl formamide solution) Titrated solution: concentration=0.1 g/dl, solvent=N-methyl-2-pyrrolidone/dimethyl formamide mixture

[Imide Bond Absorbance Ratio]

Using an infrared spectrophotometer (Model 270-3 manufactured by Hitachi, Ltd.) and using the peak height (a) from the base line of the absorbance due to imide bond at 1380 cm$^{-1}$ and the peak height (b) from the base line of the absorbance of benzene nucleus at 1500 cm$^{-1}$, the absorbance ratio (b/a) was measured under the following conditions. A sample used was a powdered sample prepared by scraping the surface of a resin film (the surface not in contact with a metal foil) and the KBr method was used in the measurement. FIG. 2 shows the IR chart of Example 3. In preparing the KBr tablet, the adjustment of sample concentration and milling was carried out such that absorbance of the benzene nucleus absorbance is in the range of 0.5 to 0.7 in terms of absolute value and the height from the baseline is not less than 0.2 in terms of absorbance. Absorbances (a) and (b) each represent, as shown in FIG. 2, a height from the baseline drawn between the bottom parts of the peak.

[Dimensional Change]

Dimensional changes in the MD and TD directions were measured according to IPC-FC241 (IPC-TM-650, 2.2.4 (c)) at 150° C. for 30 min.

[Adhesion Strength]

Using a sample from which a circuit pattern had been formed by the subtractive process, the adhesion strength between the circuit pattern and heat resistant resin layer was measured according to IPC-FC241 (IPC-TM-650, 2.4.9 (A)).

[Initiation Tear Strength]

A sample (width: 20 mm, length: 200 mm) was prepared from a resin film obtained by removing a metal foil by etching. This sample was tested according to JIS C 2318.

[Long-term Stability of Insulation Resistance Between Conductors]

Comb electrodes as prescribed in JIS Z 3197 and detailed in Table 1 were prepared. Electricity (DC 100V) was continuously supplied to the sample at 85° C. and at 85% RH for a predetermined time, and its insulation resistance between conductors (application of DC 100 V, after 1-minute retention) was measured according to JIS C 5016.

The conductor portions of the comb electrodes (excluding the terminals for electrical connection) were cover-coated with the resin solution of Example 5 to a thickness of 10 μm by screen printing under the following conditions.

Screen Printing Conditions:
  Screen material: stainless steel
  Screen mesh: #200
  Number of printing: twice
  Drying conditions: 80° C.×5 min, 150° C.×1 h, 280° C.×20 min (in a nitrogen stream)

[Long-term Stability of Dielectric Breakdown Voltage Between Conductors]

Comb electrodes as prescribed in JIS Z 3197 and detailed in Table 1 were prepared. Electricity (DC 100V) was continuously supplied to the sample at 85° C. and at 85% RH for a predetermined time, and dielectric breakdown voltage between conductors (breakdown voltage at a perception current of 0.5 mmA) was measured according to JIS C 5016.

The conductive portions of the comb electrodes (excluding the terminals for electrical connection) were cover-coated with the resin solution of Example 5 to a thickness of 10 μm by screen printing under the following conditions.

Screen Printing Conditions:
  Screen material: stainless steel
  Screen mesh: #200
  Number of printing: twice
  Drying conditions: 80° C.×5 min, 150° C.×1 h, 280° C.×20 min (in a nitrogen stream)

TABLE 1

|  | 0.2 mm pitch | 0.3 mm pitch | 0.4 mm pitch |
|---|---|---|---|
| Conductor width | 0.1 mm | 0.15 mm | 0.2 mm |
| Conductor spacing | 0.1 mm | 0.15 mm | 0.2 mm |
| Overlap length | 15.75 mm | 15.75 mm | 15.75 mm |
| Total number of electrodes | 41 | 41 | 41 |

[Moisture Absorption]

Resin films having a length and width of 50±1 mm were tested according to the following method. (When the cross section of the sample was rough, the cross-section was smoothed with P 240 or finer sandpaper as prescribed in JIS R 6252.) Five samples were used for the measurement.
(1) Test samples are left to stand for 24 hours in a thermostatic chamber maintained at 50±2° C.
(2) The test samples are placed in a weighing bottle such that the test samples do not come into contact each other, and left to stand for 24 hours at 25° C. at 90% RH with the weighing bottle lid (hereinafter simply referred to as "lid") open (dust accumulated on the surface of the test samples is swept away with a feather or a brush).
(3) The weighing bottle is quickly sealed with the lid and left to stand in a desiccator at room temperature for 1 hour.
(4) The total weight of the weighing bottle and the test samples is measured (W1). The test samples are quickly removed from the weighing bottle and the weight of the weighing bottle alone is measured (W0).
(5) The test samples are reintroduced into the weighing bottle and dried for 1 hour in a thermostatic chamber maintained at 100±5° C. with the lid open.
(6) The weighing bottle is quickly sealed with the lid and left to stand in a desiccator at room temperature for 1 hour.
(7) The total weight of the weighing bottle and the test samples is measured (W3). The test samples are quickly removed from the weighing bottle and the weight of the weighing bottle alone is measured (W4).
(8) Moisture absorption WA (%) is calculated using the following equation:

$$WA=[\{(W1-W0)-(W3-W4)\}/(W1-W0)]\times 100$$

[Ionic Impurities]

Substrate film was cut into 1 cm×1 cm pieces, 5 g thereof was placed in a quartz beaker, to which 50 ml of ultrapure water was added, and the system was heat-treated in an autoclave at 120° C. for 20 hours. The volume of water was reduced to about 40 ml (the volume of water was calculated from its weight). Na, K and Li contained in the thus-obtained sample (pure water recovered after the extraction) were quantified by atomic absorption spectrophotometry.

[Compatibility (Transparency) of the Film]

The transparency of the obtained resin film having a thickness of 25 μm was inspected visually.

[Solubility]

Solutions adjusted to a concentration of 10 wt. % were left to stand at 25° C. for 24 hours. Those that exhibited none of gelation, heterogeneity, turbidity and precipitation were regarded as soluble. The symbol "o" indicates soluble. The symbol "x" indicates not soluble.

[Curvature Radius of Curl]

The radius of curvature was determined by placing a flexible metal-clad laminate (sample size: 10 cm×10 cm) in a free state (a state in which no weight is applied in the direction of curling) as shown in FIG. 1, measuring the distance (R) between the ends 102 and 102', which do not lie on the vertical plane due to the curl of sample 100, and the distance h between the vertical plane and the ends 102 and 102', and calculating the radius of curvature r using the following equation:

Radius of curvature $(r) = (h/2) + (1/8) \times (R^2/h)$

[Moisture Absorption Dimensional Change]

(1) Holes are drilled in the metal clad laminate at specific positions thereof according to IPC-FC 241 (IPC-TM-650, 2.2.4(c)). After humidification at 25° C. at 65% RH for 4 hours, the distances between the holes are measured.
(2) The metal layer of the metal-clad laminate is completely removed (etched) with ferric chloride. The resin film thus obtained is humidified in a 20% RH, 40% RH, 65% RH, or 90% RH environment at 25° C. for 24 hours.
(3) The distances between the holes in the resin film are measured according to IPC-FC-241 (IPC-TM-650, 2.2.4 (c)), and the dimensional change is calculated based on the distances between the holes drilled in the metal-clad laminate under item (1).
(4) The dimensional change obtained in item (3) is plotted in relation to the respective relative humidities. The moisture absorption dimensional change is defined as the slope exhibited in relation to the relative humidities.

Example 1

172.9 g (90 mol %) of trimellitic acid anhydride (hereinafter abbreviated as "TMA"; purified by sublimation at 150° C. at 1 Torr; purity 99.9 mol %, trimellitic acid content: 0.1 mol %), 31.0 g (10 mol %) of 3,3',4,4'-diphenyl ether tetracarboxylic acid dianhydride (hereinafter "ODPA", purity: 99%), 264.3 g (100 mol %) of 3,3'-dimethyl-4,4'-biphenyl diisocyanate (hereinafter "TODI"; purity 99%), 2155 g of N-methyl-2-pyrrolidone (hereinafter "NMP"; purity 99.9% or higher) and 2.5 g of triethylenediamine were introduced into a reaction vessel, heated to 100° C. and reacted for 3 hours at 100° C. in a nitrogen stream. The reaction was further continued at 160° C. for 2 hours and at 180° C. for 2 hours. After adding 630 g of NMP (polymer concentration: 12 wt. %), the reaction mixture was cooled to room temperature.

Using the polymer solution thus obtained, a flexible metal-clad laminate was prepared under the processing conditions described below, and various properties thereof as detailed in Tables 2 to 5 were evaluated.

(A) Predrying Step

An 18 μm thick electrodeposited copper foil (trade name "USLP-R2", manufactured by Nippon Denkai, Ltd.) was coated with the resin solution obtained above using a knife coater to have a thickness after solvent removal of 25 μm and dried at 120° C. for 3 minutes, thereby giving a predried flexible metal-clad laminate.

(B) Heat Treatment/Solvent Removal Step

The predried laminate obtained above was wound around an aluminum can having an outer diameter of 16 inches with the coated surface facing outward, and subjected to a heat treatment in a vacuum dryer or an inert oven under the following heat treatment/solvent removal conditions (whereby the solvent contained in the coating film was completely removed).

Conditions for reduced pressure drying: 200° C.×24 hr (the pressure fluctuated between 10 and 100 Pa due to the evaporation of the solvent) Heating in a nitrogen atmosphere (flow rate: 20 L/min): 280° C.×3 hr Example 2

153.7 g (80 mol %) of TMA, 15.5 g (5 mol %) of ODPA, 48.3 g (15 mol %) of 3,3',4,4'-benzophenone tetracarboxylic acid dianhydride (hereinafter "BTDA"; purity 99%), 264.3 g (100 mol %) of TODI, 1.5 g of diazabicyclo[5.4.0]undecene-7 (hereinafter "DBU") and 2230 g of NMP were introduced into a reaction vessel, heated to 100° C. and reacted for 2 hours at 100° C. in a nitrogen stream. After continuing the reaction at 160° C. for 3 hours and adding 658 g of NMP (polymer concentration: 12 wt. %), the reaction mixture was cooled to room temperature.

Using the polymer solution thus obtained, a flexible metal-clad laminate was prepared in the same manner as in Example 1, and various properties thereof as detailed in Tables 2 to 5 were evaluated.

Example 3

153.7 g (80 mol %) of TMA, 48.3 g (15 mol %) of BTDA, 14.7 g (5 mol %) of 3,3',4,4'-biphenyl tetracarboxylic acid dianhydride (hereinafter "BPDA"; purity 99%), 264.3 g (100 mol %) of TODI, 1.5 g of DBU and 2230 g of NMP (purity 99.9%) were introduced into a reaction vessel, heated to 100° C. and reacted for 2 hours at 100° C. in a nitrogen stream. After continuing the reaction at 150° C. for 1 hour and adding 1307 g of NMP (polymer concentration: 10 wt. %), the reaction mixture was cooled to room temperature.

Using the polymer solution thus obtained, a flexible metal-clad laminate was prepared in the same manner as in Example 1, and various properties thereof as detailed in Tables 2 to 5 were evaluated.

Example 4

153.7 g (80 mol %) of TMA, 48.3 g (15 mol %) of BTDA, 20.5 g (5 mol %) of ethylene glycol bis(anhydrotrimellitate) (TMEG; purity 99%), 264.3 g (100 mol %) of TODI, 1.5 g of DBU and 598 g of NMP were introduced into a reaction vessel, heated to 100° C. and reacted for 5 hours at 100° C. in a nitrogen stream. After adding 997 g of NMP, continuing the reaction at 160° C. for 3 hours and adding 849 g more of NMP (polymer concentration: 14 wt. %), the reaction mixture was cooled to room temperature.

Using the polymer solution thus obtained, a flexible metal-clad laminate was prepared in the same manner as in Example 1, and various properties thereof as detailed in Tables 2 to 5 were evaluated.

Example 5

153.7 g (80 mol %) of TMA, 32.2 g (10 mol %) of BTDA, 14.7 g (5 mol %) of BPDA, 15.5 g (5 mol %) of ODPA, 264.3 g (100 mol %) of TODI, 1.5 g of DBU and 2220 g of NMP (polymer concentration: 15 wt. %) were introduced into a reaction vessel, heated to 100° C. and reacted for 2 hours at 100° C. in a nitrogen stream. After continuing the reaction at 160° C. for 3 hours, the reaction mixture was cooled to room temperature.

Using the polymer solution thus obtained, a flexible metal-clad laminate was prepared in the same manner as in Example 1, and various properties thereof as detailed in Tables 2 to 5 were evaluated.

Example 6

134.5 g (70 mol %) of TMA, 80.6 g (25 mol %) of BTDA, 14.7 g (5 mol %) of BPDA, 266.9 g (100 mol %) of TODI, 1.5 g of DBU and 2500 g of NMP were introduced into a reaction vessel, heated to 100° C. and reacted for 2 hours at 100° C. in a nitrogen stream. After continuing the reaction at 150° C. for 2 hours and at 150° C. for 2 hours, the reaction mixture was cooled to room temperature.

Using the polymer solution thus obtained, a flexible metal-clad laminate was prepared in the same manner as in Example 1, and various properties thereof as detailed in Tables 2 to 5 were evaluated.

Comparative Example 1

153.7 g (80 mol %) of TMA, 42.0 g (20 mol %) of trimellitic acid, 211.4 g (80 mol %) of TODI (purity 99% or higher), 50.1 g (20 mol %) of 4,4'-diphenylmethane diisocyanate, 1.5 g of potassium fluoride and 1477 g of NMP were introduced into a 2 5 reaction vessel, heated to 50° C. and reacted for 2 hours at 50° C. in a nitrogen stream.

After continuing the reaction at 100° C. for 10 hours and at 120° C. for 5 hours and further adding 615 g of NMP (polymer concentration: 15 wt. %), the reaction vessel was cooled to room temperature.

Using the polymer solution thus obtained, a flexible metal-clad laminate was prepared in the same manner as in Example 1, and various properties thereof as detailed in Tables 2 to 7 were evaluated.

Comparative Example 2

192.3 g (100 mol %) of TMA, 264.3 g (100 mol %) of TODI and 1473 g of NMP were introduced into a reaction vessel, heated to 100° C. and reacted for 2 hours at 100° C. in a nitrogen stream. After continuing the reaction at 160° C. for 4 hours and further adding 614 g of NMP (polymer concentration: 15 wt. %), the reaction mixture was cooled to room temperature. The polymerization solution was homogeneous during heating, but turned heterogeneous after cooling.

Comparative Example 3

322.2 g (100 mol %) of BTDA, 264.3 g (100 mol %) of TODI and 1979 g of NMP were introduced into a reaction vessel, heated to 100° C. and reacted for 2 hours at 100° C. in a nitrogen stream. The polymer thus formed did not dissolve in the solvent, resulting in a heterogeneous mixture.

Comparative Example 4

294.2 g (100 mol %) of BPDA, 264.3 g (100 mol %) of TODI and 1882 g of NMP were introduced into a reaction vessel, heated to 100° C. and reacted for 2 hours at 100° C. in a nitrogen stream. The polymer thus formed did not dissolve in the solvent, resulting in a heterogeneous mixture.

Comparative Example 5

310.2 g (100 mol %) of ODPA, 264.3 g (100 mol %) of TODI and 2757 g of NMP were introduced into a reaction vessel, heated to 100° C. and reacted for 2 hours at 100° C. and for 2 hours at 160° C. in a nitrogen stream. The polymer thus formed did not dissolve in the solvent, resulting in a heterogeneous mixture.

Comparative Example 6

172.9 g (90 mol %) of TMA, 32.2 g (10 mol %) of BTDA, 264.3 g (100 mol %) of TODI (purity 99% or higher) and 2000 g of NMP were introduced into a reaction vessel, heated to 200° C. over 1 hour and stirred for 5 hours at 200° C. in a nitrogen stream, and the reaction mixture was cooled to room temperature. The solids content was adjusted to 10% by adding 1400 g of NMP.

The polymer solution thus obtained, when subjected to a storage test at 5° C. for 1-month, solidified and looked like a pudding.

Comparative Example 7

134.5 g (70 mol %) of TMA, 96.6 g (30 mol %) of BTDA, 264.3 g (100 mol %) of TODI (purity 99% or higher) and 2000 g of NMP were introduced into a reaction vessel, heated to 200° C. over 1 hour and stirred for 5 hours at 200° C. in a nitrogen stream, and the reaction mixture was cooled to room temperature. The solids content was adjusted to 10% by adding 1600 g of NMP.

The polymer solution thus obtained, when subjected to a storage test at 5° C. for 1-month, solidified and looked like a pudding.

Comparative Example 8

156.8 g (80 mol %) of TMA, 65.7 g (20 mol %) of BTDA, 264.3 g (100 mol %) of TODI (purity 99% or higher) and 2000 g of NMP were introduced into a reaction vessel, heated to 200° C. over 1 hour and stirred for 5 hours at 200° C. in a nitrogen stream. The polyamide-imide resin thus obtained had an inherent viscosity of 0.81.

The change in solution viscosity measured was 4.0 in absolute value, indicating that the solution viscosity tended to increase. Formation of an FCL was attempted using the solution with such increased viscosity, but it was not possible to form a uniform film.

TABLE 2

|  | Inherent viscosity (dl/g) | Acid value (μeq/g) | Solubility | Solution viscosity change in absolute value |
|---|---|---|---|---|
| Ex. 1 | 15.1 | 5 | ○ | 0.1 |
| Ex. 2 | 1.48 | 10 | ○ | 0.0 |
| Ex. 3 | 1.26 | 15 | ○ | 0.0 |
| Ex. 4 | 1.02 | 10 | ○ | 0.1 |
| Ex. 5 | 1.63 | 10 | ○ | 0.1 |
| Ex. 6 | 1.61 | 9 | ○ | 2.5 |
| Comp. Ex. 1 | 1.44 | 150 | ○ | 0.1 |
| Comp. Ex. 6 | 1.65 | 15 | ○ | ∞ |
| Comp. Ex. 7 | 1.54 | 18 | ○ | ∞ |
| Comp. Ex. 8 | 0.81 | 110 | ○ | 4.0 |

TABLE 3

| | Insoluble content (%) | Moisture absorption (%) | Tg (° C.) | Thermal expansion coefficient (° C.$^{-1}$) | Ionic impurities (mg/Kg) Na | K | Li | Acid value (μeq/g) | Imide absorbance | Moisture absorption dimensional change (ppm/% RH) |
|---|---|---|---|---|---|---|---|---|---|---|
| Ex. 1 | 50 | 1.2 | 340 | $2.45 \times 10^{-5}$ | 0.3 | 0.2 | <0.1 | — | 1.29 | 10 |
| Ex. 2 | 32 | 1.3 | 344 | $2.41 \times 10^{-5}$ | 0.1 | 0.3 | <0.1 | 8 | 1.3 | 11 |
| Ex. 3 | 68 | 0.8 | 350 | $2.10 \times 10^{-5}$ | 0.2 | 0.3 | <0.1 | — | 1.22 | 9 |
| Ex. 4 | 21 | 0.9 | 335 | $2.59 \times 10^{-5}$ | 0.1 | 0.1 | <0.1 | 5 | 1.22 | 9 |
| Ex. 5 | 43 | 0.8 | 354 | $2.05 \times 10^{-5}$ | 0.5 | 0.1 | <0.1 | — | 1.25 | 9 |
| Ex. 6 | 25 | 1.4 | 348 | $2.12 \times 10^{-5}$ | 0.3 | 0.1 | <0.1 | 9 | 1.05 | 12 |
| Comp. Ex. 1 | 18 | 2.9 | 311 | $3.01 \times 10^{-5}$ | 0.4 | >5 | <0.1 | 130 | 0.88 | 25 |

TABLE 4

| | Curvature radius of curl (mm) | |
|---|---|---|
| | After humidification | After heating |
| Ex. 1 | 75 | −75 |
| Ex. 2 | flat | −115 |
| Ex. 3 | flat | flat |
| Ex. 4 | flat | −90 |
| Ex. 5 | flat | −450 |
| Ex. 6 | flat | −121 |
| Comp. Ex. 1 | 35 | −30 |

*Curvature radius of curl: a curl that made the coated surface convex was indicated to have "+" direction.

TABLE 5

| | Solder heat resistance Ordinary conditions | After humidification | Dimensional change (%) MD direction | TD direction | Adhesion strength (g/mm) | Initiation tear strength (Kg) |
|---|---|---|---|---|---|---|
| Ex. 1 | ○ | ○ | 0.023 | −0.009 | 96 | 24 |
| Ex. 2 | ○ | ○ | −0.022 | −0.035 | 101 | 26 |
| Ex. 3 | ○ | ○ | 0.005 | −0.032 | 98 | 28 |
| Ex. 4 | ○ | ○ | −0.051 | −0.06 | 93 | 27 |
| Ex. 5 | ○ | ○ | −0.022 | −0.025 | 110 | 29 |
| Ex. 6 | ○ | ○ | −0.011 | −0.009 | 93 | 24 |
| Comp. Ex. 1 | ○ | X | −0.082 | −0.091 | 109 | 16 |

With respect to flexible printed wiring boards prepared using these flexible metal-clad laminates, various properties thereof as detailed in Tables 6 and 7 were evaluated.

TABLE 6

| | 0.2 mm pitch | 0.3 mm pitch | 0.4 mm pitch |
|---|---|---|---|
| | Insulation resistance between conductors before treatment: blank (Ω) | | |
| Ex. 1 | $1.3 \times 10^{13}$ | $1.2 \times 10^{13}$ | $2.8 \times 10^{13}$ |
| Ex. 2 | $2.2 \times 10^{13}$ | $2.1 \times 10^{13}$ | $2.6 \times 10^{13}$ |
| Ex. 3 | $8.2 \times 10^{12}$ | $8.3 \times 10^{12}$ | $8.6 \times 10^{12}$ |
| Ex. 4 | $2.5 \times 10^{12}$ | $3.0 \times 10^{12}$ | $5.3 \times 10^{12}$ |
| Ex. 5 | $2.5 \times 10^{12}$ | $3.5 \times 10^{12}$ | $3.5 \times 10^{12}$ |
| Ex. 6 | $2.3 \times 10^{13}$ | $2.0 \times 10^{13}$ | $2.2 \times 10^{13}$ |
| Comp. Ex. 1 | $6.7 \times 10^{10}$ | $1.3 \times 10^{11}$ | $1.9 \times 10^{11}$ |
| | Insulation resistance between conductors after 1000 hours: (Ω) | | |
| Ex. 1 | $7.9 \times 10^{12}$ | $8.5 \times 10^{12}$ | $9.1 \times 10^{12}$ |
| Ex. 2 | $9.3 \times 10^{12}$ | $9.6 \times 10^{12}$ | $9.8 \times 10^{12}$ |
| Ex. 3 | $8.8 \times 10^{12}$ | $7.6 \times 10^{12}$ | $9.4 \times 10^{12}$ |
| Ex. 4 | $1.5 \times 10^{12}$ | $2.5 \times 10^{12}$ | $4.5 \times 10^{12}$ |
| Ex. 5 | $2.0 \times 10^{12}$ | $3.2 \times 10^{12}$ | $3.5 \times 10^{12}$ |
| Ex. 6 | $2.9 \times 10^{12}$ | $2.6 \times 10^{12}$ | $2.0 \times 10^{12}$ |
| Comp. Ex. 1 | not greater than $10^{10}$ | not greater than $10^{10}$ | not greater than $10^{10}$ |
| | Insulation resistance between conductors after 2000 hours: (Ω) | | |
| Ex. 1 | $8.3 \times 10^{12}$ | $8.3 \times 10^{12}$ | $8.8 \times 10^{12}$ |
| Ex. 2 | $2.1 \times 10^{13}$ | $2.0 \times 10^{13}$ | $8.8 \times 10^{12}$ |
| Ex. 3 | $8.2 \times 10^{12}$ | $8.3 \times 10^{12}$ | $8.6 \times 10^{12}$ |
| Ex. 4 | $2.0 \times 10^{12}$ | $2.0 \times 10^{12}$ | $3.5 \times 10^{12}$ |
| Ex. 5 | $8.9 \times 10^{11}$ | $8.8 \times 10^{11}$ | $8.5 \times 10^{11}$ |
| Ex. 6 | $2.0 \times 10^{12}$ | $2.0 \times 10^{12}$ | $1.8 \times 10^{12}$ |
| Comp. Ex. 1 | — | — | — |
| | Insulation resistance between conductors after 3000 hours: (Ω) | | |
| Ex. 1 | $8.3 \times 10^{12}$ | $8.3 \times 10^{12}$ | $8.8 \times 10^{12}$ |
| Ex. 2 | $2.1 \times 10^{13}$ | $2.0 \times 10^{13}$ | $8.8 \times 10^{12}$ |
| Ex. 3 | $8.2 \times 10^{12}$ | $8.3 \times 10^{12}$ | $8.6 \times 10^{12}$ |
| Ex. 4 | $1.0 \times 10^{12}$ | $1.5 \times 10^{12}$ | $3.0 \times 10^{12}$ |

TABLE 6-continued

|  | 0.2 mm pitch | 0.3 mm pitch | 0.4 mm pitch |
|---|---|---|---|
| Ex. 5 | not greater than $10^{10}$ | not greater than $10^{10}$ | not greater than $10^{10}$ |
| Ex. 6 | $1.8 \times 10^{12}$ | $1.6 \times 10^{12}$ | $1.3 \times 10^{12}$ |
| Comp. Ex. 1 | — | — | — |

TABLE 7

|  | 0.2 mm pitch | 0.3 mm pitch | 0.4 mm pitch |
|---|---|---|---|
| Before treatment: blank (KV) | | | |
| Ex. 1 | not less than 5.0 | not less than 5.0 | not less than 5.0 |
| Ex. 2 | not less than 5.0 | not less than 5.0 | not less than 5.0 |
| Ex. 3 | not less than 5.0 | not less than 5.0 | not less than 5.0 |
| Ex. 4 | not less than 5.0 | not less than 5.0 | not less than 5.0 |
| Ex. 5 | not less than 5.0 | not less than 5.0 | not less than 5.0 |
| Ex. 6 | not less than 5.0 | not less than 5.0 | not less than 5.0 |
| Comp. Ex. 1 | not less than 5.0 | not less than 5.0 | not less than 5.0 |
| After 1000 hours: (KV) | | | |
| Ex. 1 | not less than 5.0 | not less than 5.0 | not less than 5.0 |
| Ex. 2 | not less than 5.0 | not less than 5.0 | not less than 5.0 |
| Ex. 3 | not less than 5.0 | not less than 5.0 | not less than 5.0 |
| Ex. 4 | 4.2 | 4.1 | 4.6 |
| Ex. 5 | 4.1 | 4.1 | 4 |
| Ex. 6 | not less than 5.0 | not less than 5.0 | not less than 5.0 |
| Comp. Ex. 1 | not greater than 1.0 | not greater than 1.0 | not greater than 1.0 |
| After 2000 hours: (KV) | | | |
| Ex. 1 | not less than 5.0 | not less than 5.0 | not less than 5.0 |
| Ex. 2 | not less than 5.0 | not less than 5.0 | not less than 5.0 |
| Ex. 3 | 3.8 | 4.8 | not less than 5.0 |
| Ex. 4 | 4 | 4.1 | 4.6 |
| Ex. 5 | 2.3 | 2 | 1.8 |
| Ex. 6 | not less than 5.0 | not less than 5.0 | not less than 5.0 |
| Comp. Ex. 1 | — | — | — |
| After 3000 hours: (KV) | | | |
| Ex. 1 | not less than 5.0 | not less than 5.0 | not less than 5.0 |
| Ex. 2 | not less than 5.0 | not less than 5.0 | not less than 5.0 |
| Ex. 3 | 4.1 | 4.6 | not less than 5.0 |
| Ex. 4 | 3.2 | 1.8 | 1.6 |
| Ex. 5 | not greater than 1.0 | not greater than 1.0 | not greater than 1.0 |
| Ex. 6 | not less than 5.0 | not less than 5.0 | not less than 5.0 |
| Comp. Ex. 1 | — | — | — |

INDUSTRIAL APPLICABILITY

As described above, the flexible metal-clad laminate of the invention does not curl under any conditions, including humid conditions, and exhibits excellent dimensional stability since the heat resistant resin used as an insulation material has a low moisture absorption and a low thermal expansion coefficient and the flexible metal-clad laminate has less internal stress. Moreover, since the solder heat resistance and the insulation properties are not impaired even after humidification, and since the heat resistant resin is soluble in organic solvents with high solution stability, the flexible metal-clad laminate of the invention can be inexpensively produced and thus is industrially advantageous.

The invention claimed is:

1. A polyamide-imide resin which is a copolymerized polyamide-imide that consists essentially of constitutional units represented by Formulae (1), (2), and (3) shown below:

Formula (1):

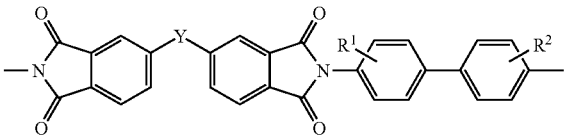

wherein $R^1$ and $R^2$ are the same or different, and independently represent hydrogen or $C_{1-4}$ alkyl or alkoxy; and Y represents a direct linkage or ether linkage;

Formula (2):

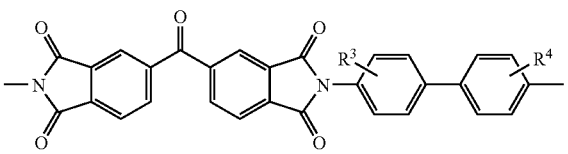

wherein $R^3$ and $R^4$ are the same or different, and independently represent hydrogen or $C_{1-4}$ alkyl or alkoxy; and Formula (3):

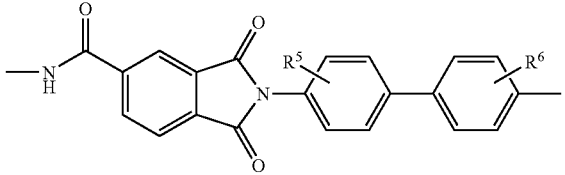

wherein $R^5$ and $R^6$ are the same or different, and independently represent hydrogen or $C_{1-4}$ alkyl or alkoxy, and
wherein the polyamide-imide resin satisfies the molar ratios of Formula (1)/Formula (2)=1/99 to 99/1 and [Formula (1)+Formula (2)]/Formula (3)=30/70 to 1/99.

2. The polyamide-imide resin of claim 1, wherein the polyamide-imide resin comprises as acid components trimellitic acid anhydride/3,3',4,4'-benzophenone tetracarboxylic acid dianhydride/3,3',4,4'-biphenyl tetracarboxylic acid dianhydride in proportions of 70-90/5-25/5-25 mol % and as a diamine component 3,3'-dimethyl-4,4'-biphenyldiamine or its corresponding diisocyanate, when the total of acid components and the total of amine components, in the polyamide-imide resin, are each taken as 100 mol %.

3. The polyamide-imide resin of claim 1, wherein the polyamide-imide resin comprises as acid components trimellitic acid anhydride/3,3',4,4'-benzophenone tetracarboxylic acid dianhydride/3,3',4,4'-diphenyl ether tetracarboxylic acid dianhydride in proportions of 70-90/5-25/5-25 mol % and as a diamine component 3,3'-dimethyl-4,4'-biphenyldiamine or its corresponding diisocyanate, when the total of acid components and the total of amine components, in the polyamide-imide resin, are each taken as 100 mol %.

4. The polyamide-imide resin of claim 1, wherein the polyamide-imide resin has a glass transition temperature of not less than 250° C.

5. The polyamide-imide resin of claim 1, wherein the polyamide-imide resin has a ratio of imide bond absorbance to benzene nucleus absorbance of not less than 0.9.

6. The polyamide-imide resin of claim 1, wherein the polyamide-imide resin contains ionic impurities in an amount of not greater than 2 mg/kg.

7. The polyamide-imide resin of claim 1, wherein the polyamide-imide resin has an acid value of not greater than 150 µeq/g.

8. A polyamide-imide resin which is a copolymerized polyamide-imide that consisting essentially of constitutional units represented by Formulae (4), (5), and (6) shown below:

Formula (4):

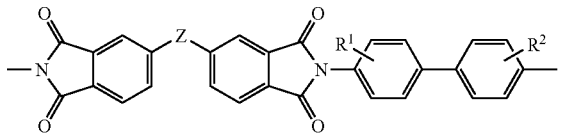

wherein $R^1$ and $R^2$ are the same or different, and independently represent hydrogen or $C_{1-4}$ alkyl or alkoxy; and Z represents —COO—R'—OCO—, wherein R' is a divalent alkylene group or aromatic residue;

Formula (5):

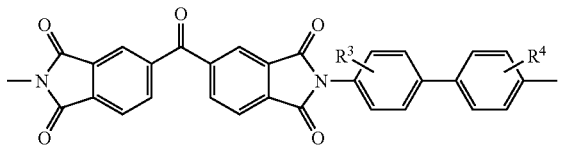

wherein $R^3$ and $R^4$ are the same or different, and independently represent hydrogen or $C_{1-4}$ alkyl or alkoxy; and Formula (6):

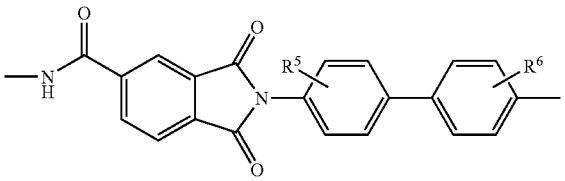

wherein $R^5$ and $R^6$ are the same or different, and independently represent hydrogen or $C_{1-4}$ alkyl or alkoxy, and wherein the polyamide-imide resin satisfies the molar ratios of Formula (4)/Formula (5)=1/99 to 99/1 and [Formula (4)+Formula (5)]/Formula (6)=50/50 to 1/99.

9. The polyamide-imide resin of claim 8, wherein the polyamide-imide resin comprises, as acid components, trimellitic acid anhydride/3,3',4,4-benzophenone tetracarboxylic acid dianhydride/ethylene glycol bis(anhydrotrimellitate) in proportions of 70-90/5-25/5-25 mol % and, as a diamine component, 3,3'-dimethyl-4,4'-biphenyldiamine or its corresponding diisocyanate, when the total of acid components and the total of amine components, in the polyamide-imide resin, are each taken as 100 mol %.

10. The polyamide-imide resin of claim 8, wherein the polyamide-imide resin comprises as acid components trimellitic acid anhydride/3,3',4,4-benzophenone tetracarboxylic acid dianhydride/propylene glycol bis(anhydrotrimellitate) in proportions of 70-90/5-25/5-25 mol % and as a diamine component 3,3'-dimethyl-4,4'-biphenyldiamine or its corresponding diisocyanate.

11. The polyamide-imide resin of claim 8, wherein the polyamide-imide resin comprises as acid components trimellitic acid anhydride/3,3',4,4-benzophenone tetracarboxylic acid dianhydride/2,2-bis(4-hydroxyphenyl)propanedibenzoate-3,3',4,4'-tetracarboxylic acid dianhydride in proportions of 70-90/5-25/5-25 mol % and as a diamine component 3,3'-dimethyl-4,4'-biphenyldiamine or its corresponding diisocyanate.

12. The polyamide-imide resin of claim 8, wherein the polyamide-imide resin has a glass transition temperature of not less than 250° C.

13. The polyamide-imide resin of claim 8, wherein the polyamide-imide resin has a ratio of imide bond absorbance to benzene nucleus absorbance of not less than 0.9.

14. The polyamide-imide resin of claim 8, wherein the polyamide-imide resin contains ionic impurities in an amount of not greater than 2 mg/kg.

15. The polyamide-imide resin of claim 8, wherein the polyamide-imide resin has an acid value of not greater than 150 µeq/g.

* * * * *